United States Patent [19]

Vasseghi

[11] Patent Number: 4,789,797

[45] Date of Patent: Dec. 6, 1988

[54] TEMPERATURE-COMPENSATED INTERFACE CIRCUIT BETWEEN "OR-TIED" CONNECTION OF A PLA DEVICE AND A TTL OUTPUT BUFFER

[75] Inventor: Nader Vasseghi, Sunnyvale, Calif.

[73] Assignee: Advanced Micro Devices, Inc., Sunnyvale, Calif.

[21] Appl. No.: 66,915

[22] Filed: Jun. 25, 1987

[51] Int. Cl.$^4$ .................................... H03K 19/003
[52] U.S. Cl. ............................ 307/475; 307/310; 307/456; 307/466
[58] Field of Search ............... 307/456, 310, 465–466, 307/475, 530, 540, 297; 323/312–314

[56] References Cited

U.S. PATENT DOCUMENTS

| | | | |
|---|---|---|---|
| 4,460,865 | 7/1984 | Bynum et al. | 323/313 |
| 4,514,650 | 4/1985 | Yum | 307/466 |
| 4,590,418 | 5/1986 | Moriarty, Jr. | 323/313 |
| 4,626,770 | 12/1986 | Price, Jr. | 323/313 X |
| 4,677,368 | 6/1987 | Bynum | 323/313 X |
| 4,677,369 | 6/1987 | Bowers et al. | 307/310 X |
| 4,701,636 | 10/1987 | Millhollan et al. | 307/466 X |

Primary Examiner—Stanley D. Miller
Assistant Examiner—D. R. Hudspeth
Attorney, Agent, or Firm—Davis Chin

[57] ABSTRACT

An interface circuit (110) for interfacing between an "OR-tied" connection (P) of a programmable logic array device (10) and a TTL output buffer (36) includes a first bandgap generator (40), a high level clamp circuit (30), a second bandgap generator circuit (42), and a sensing circuit (26). The first bandgap generator (40) generates a first reference voltage (VB1) which has a positive temperature coefficient. The second bandgap generator (42) generates a second reference voltage (VB2) which has a negative temperature coefficient. A resultant base drive current $(I_x)$ is supplied to the base of a phase splitter transistor (Q2) in the output buffer (36). The resultant current $(I_x)$ is controlled by the first and second bandgap generators (40, 42), the current being higher at low temperatures and being smaller at high temperatures.

16 Claims, 4 Drawing Sheets

4,789,797

TEMPERATURE-COMPENSATED INTERFACE CIRCUIT BETWEEN "OR-TIED" CONNECTION OF A PLA DEVICE AND A TTL OUTPUT BUFFER

BACKGROUND OF THE INVENTION

This invention relates generally to programmable logic array (PLA) devices and more particularly, it relates to an interface circuit for interfacing between the "OR-Tied" connection of a PLA device and the phase splitter transistor of a TTL output buffer so as to provide a high speed of operation over a wide range of temperature variations.

As is generally known, arrays for performing logic functions are typically referred to as logic arrays or programmable logic arrays (PLAs) and have been used in recent years to replace random logic in many digital circuits. Such programmable logic arrays are especially useful in the control section of digital systems and are frequently thought of as read-only storage, read-only memories, or the like. The programmable logic array is a well known conventional way of using arrays of identical circuit elements to implement arbitrary logic function in integrated circuits.

A simplified schematic circuit diagram of a TTL programmable logic array device 10 with a Schottky diode array structure 12 of the prior art is shown in FIG. 1 and has been labeled "Prior Art." One of the major problems experienced in this prior art PLA device 10 is that extra propagation delays are encountered due to the double inversion in the buffer 34 having the two inverter stages. This buffer stage is required to properly interface the "OR-tied" to the output buffer and provide necessary level and drive to the output stage 36 over operating temperature range.

The interface circuit 110 of the present invention for use between the "OR-tied" connected of a PLA device and the phase splitter transistor of a TTL output buffer is an improvement over the one of FIG. 1 and exhibits a high speed of operation over a wide range of temperature variations. This is achieved by the elimination of the buffer 34 having the two inverter stages so that the output of the sensing circuit 26 is connected directly to the phase splitter transistor Q2 of the output buffer 36. Since the beta (current gain) of the phase splitter transistor Q2 will increase with temperature, a smaller current drive is required at the higher temperatures. Two independent bandgap generators with opposite temperature coefficients are provided so as to generate a resultant base drive current to the phase splitter transistor Q2 which is greater at the lower temperature of −55° C. and is less at the high temperature of +155° C., thereby maintaining a high switching speed over the temperature range.

SUMMARY OF THE INVENTION

Accordingly, it is a general object of the present invention to provide an improved interface circuit which overcomes the disadvantages of the prior art.

It is an object of the present invention to provide an interface circuit which has a high speed of operation over a wide range of temperatures variations.

It is another object of the present invention to provide an interface circuit for interfacing between the "OR-tied" connection of a PLA device and the phase splitter transistor of a TTL output buffer which eliminates the need of a buffer having two inverter stages so as to reduce propagation delays.

It is still another object of the present invention to provide an interface circuit which includes two independent bandgap generators with opposite temperature coefficients so as to generate a resultant base drive current to a phase splitter transistor that is greater at low temperatures and is less at higher temperatures.

In accordance with these aims and objectives, the present invention is concerned with the provision of an interface circuit for interfacing between an "OR-tied" connection of a PLA device and a TTL output buffer so as to provide a high speed of operation over a wide range of temperature variations which includes a first bandgap generator circuit, a high level clamp circuit, a second bandgap generator circuit, and a sensing circuit. The first bandgap generator circuit provides a first reference voltage which has a positive temperature coefficient. The high level clamp circuit is responsive to the first reference voltage for producing a first current which decreases with increasing temperatures. The second bandgap generator circuit provides a second reference voltage which has a negative temperature coefficient. The sensing circuit has an input connected to receive the first current and is responsive to the second reference voltage for producing a second current which increases with increasing temperatures. The sensing circuit combines the first and second currents to generate a resultant base drive current which is higher at low temperatures and is smaller at high temperatures. The output buffer has a phase splitter transistor whose base is connected to receive the resultant base drive current, thereby providing a substantially constant switching speed over a wide range of temperature variations.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
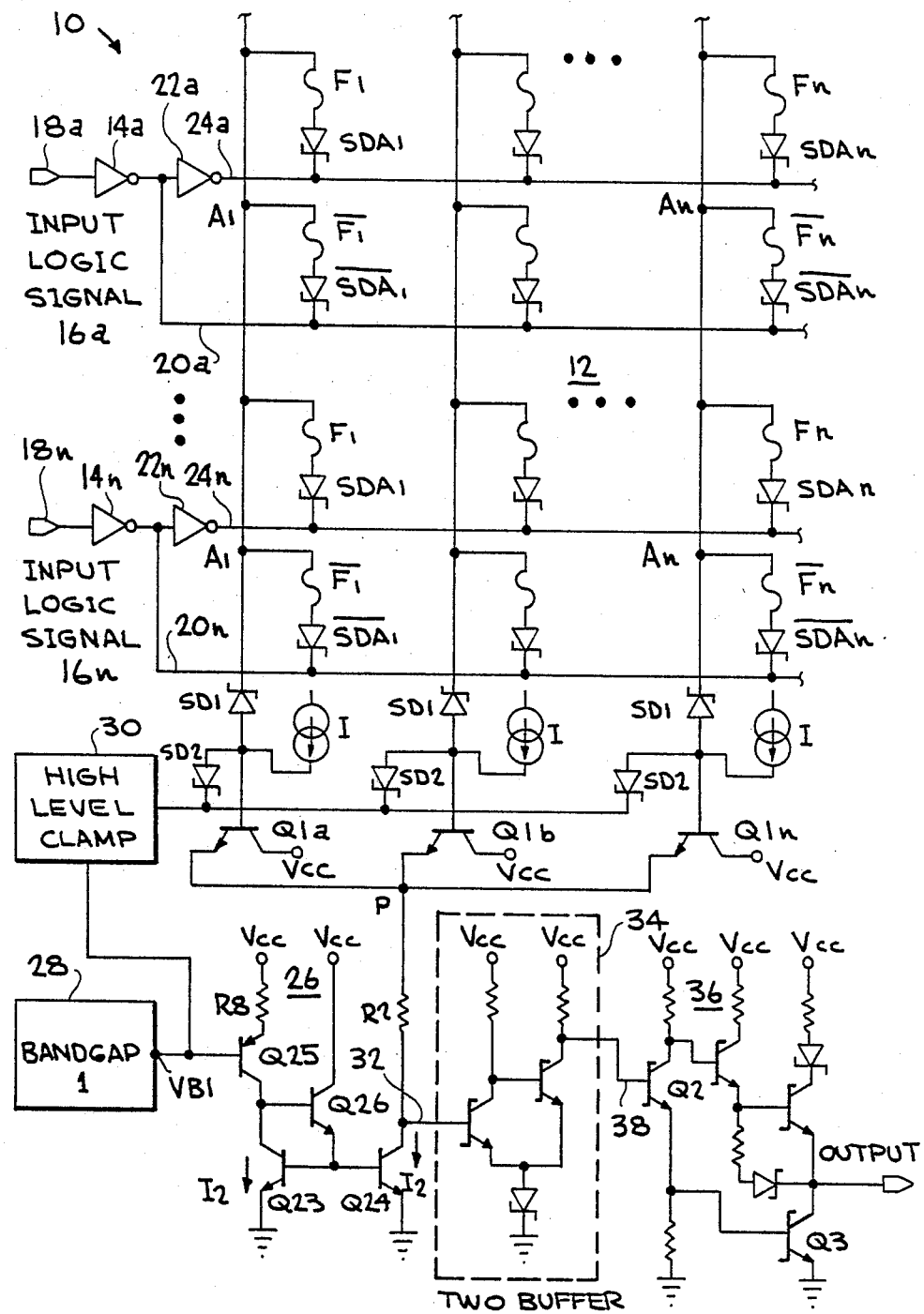
FIG. 1 is a simplified schematic circuit diagram of a TTL programmable logic array device with a Schottky diode array structure of the prior art.

Referring now to the drawings, there is shown in FIG. 1 a simplified schematic circuit diagram of a TTL programmable logic array device 10 with a Schottky diode array structure 12 of the prior art. The prior art PLA device 10 includes a plurality of input buffers 14a ... 14n. Input logic signals 16a ... 16n on respective input terminals 18a ... 18n are connected to the corresponding inputs of the plurality of input buffers 14a ... 14n. The input buffers are standard circuits which buffer the input logic signals as well as to provide inverted output signals on lines 20a ... 20n. The output of the input buffer 14a on the line 20a is connected to the cathodes of Schottky diodes $\overline{SDA1}$ ... $\overline{SDAn}$. The respective anodes of the Schottky diodes $\overline{SDA1}$ ... $\overline{SDAn}$ are connected to one end of corresponding blowable fuses $\overline{F1}$ ... $\overline{Fn}$. The other end of the fuses $\overline{F1}$ ... $\overline{Fn}$ are connected to corresponding common nodes A1 ... An. Similarly, the output of the input buffer 14n on the line 20n is connected to the cathodes of Schottky diodes $\overline{SDA1}$ ... $\overline{SDAn}$. The anodes of the Schottky diodes $\overline{SDA1}$ ... $\overline{SDAn}$ are connected to one end of corresponding blowable fuses $\overline{F1}$ ... $\overline{Fn}$. The other ends of the fuses $\overline{F1}$ ... $\overline{Fn}$ are connected to the respective common nodes A1 ... An.

The PLA device 10 further includes a plurality of input buffers 22a ... 22n for generating non-inverted output signals on lines 24a ... 24n. The input buffer 22a has its input connected to the output of the input buffer 14a and its output on the line 24a connected to the cathodes of the Schottky diodes SDA1 ... SDAn. The respective anodes of the Schottky diodes SDA1 ... SDAn are connected to one end of corresponding blowable fuses F1 ... Fn. The other ends of the respective fuses F1 ... Fn are connected to the corresponding common nodes A1 ... An. Similarly, the input buffer 22n has its input connected to the output of the input buffer 14n and its output on the line 24n connected to the cathodes of Schottky diodes SDA1 ... SDAn. The respective anodes of the Schottky diodes SDA1 ... SDAn are connected to one end of corresponding blowable fuses F1 ... Fn. The other ends of the respective fuses F1 ... Fn are connected to the corresponding common nodes A1 ... An.

Each of the common nodes A1 ... An are coupled via Schottky diodes SDA1 to the bases of the respective transistors Q1a ... Q1n and also to the programming circuit (not shown) which provides the capability to blow fuses. The collectors of the transistors Q1a ... Q1n are connected to a supply voltage or potential VCC, which is typically at +5.0 volts. The emitters of the transistors Q1a ... Q1n are all connected together to a common node or point P which is commonly referred to as an "OR-tied" connection. The node or point P is also fed to an input of the sensing circuit 26. The current I₂ in the sensing circuit 26 is controlled by a voltage VB1 having a positive temperature coefficient from a bandgap generator 28. The voltage VB1 is also used to control the current I₁ in a high level clamp circuit 30. The output of the sensing circuit 26 on line 32 is fed to a buffer 34 having two inverter stages to properly interface and provide current driving capability of a TTL output buffer 36.

Figure 2:
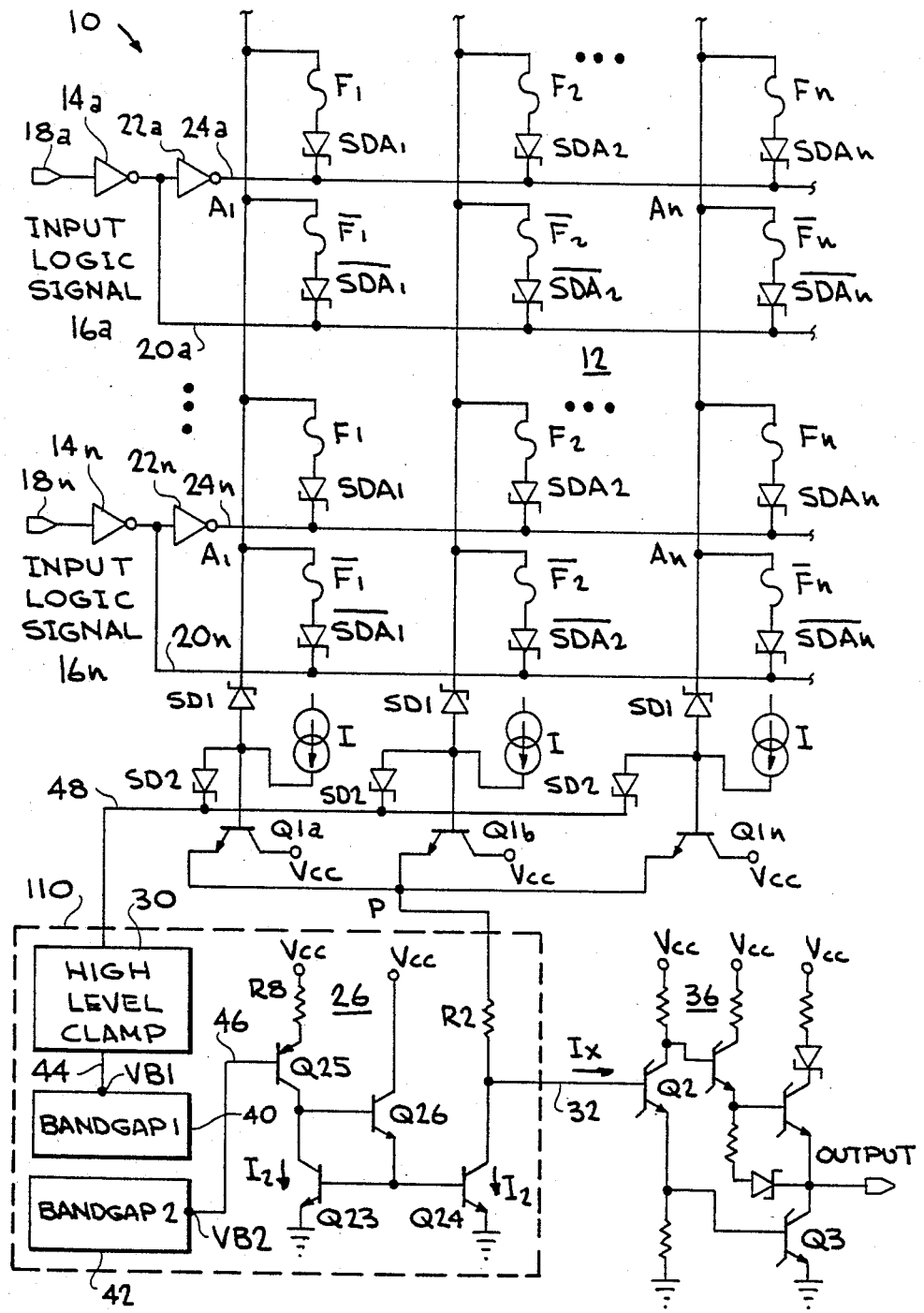
FIG. 2 is a schematic circuit diagram of an interface circuit of the present invention.

FIG. 2 is a schematic circuit diagram of an interface circuit 110 of the present invention for interfacing between the "OR-tied" connection of the PLA device 10 and the phase splitter transistor Q2 of the TTL output buffer 36. The circuit of FIG. 2 represents an improvement over the circuit of FIG. 1 and has a high speed of operation over a wide range of temperature variations. As can be seen from comparing FIGS. 1 and 2, the interface circuit 110 interconnected between the device 10 and the output buffer 36 does not include the buffer 34 (FIG. 1) with its two inverter stages. As a result, the output of the sensing circuit 26 on the line 32 is connected directly to the base of the phase splitter transistor Q2 of the output buffer 36. Further, the interface circuit 110 includes a first bandgap generator 40 which has a positive temperature coefficient and is similar to the bandgap generator 28 of FIG. 1 and a second bandgap generator 42 which has a negative temperature coefficient. Consequently, a resultant drive current $I_x$ is created at the base of the phase splitter transistor Q2 which is higher at low temperatures and is lower at high temperatures, thereby maintaining a substantially constant switching speed over the temperature range of −55° C. and +155° C.

Figure 6:
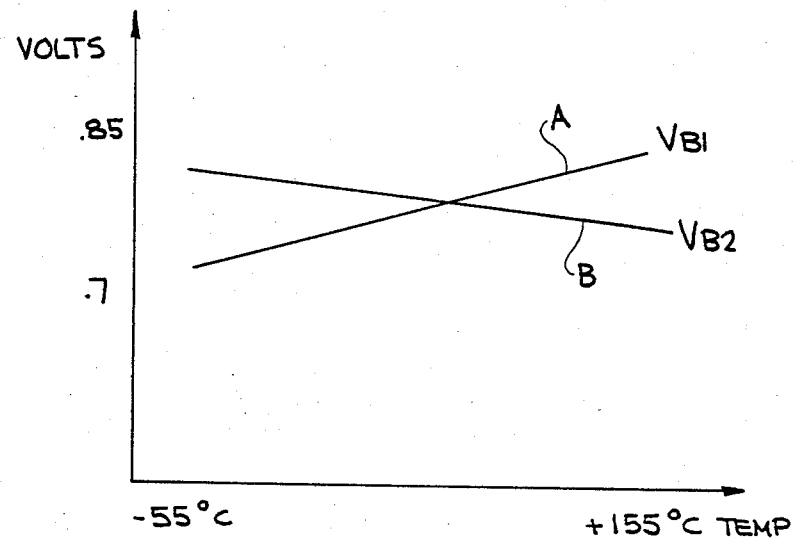
FIG. 6 are plots showing the operating characteristics of the reference voltages VB1 and VB2 of the bandgap generators over the temperature range.

The bandgap generator 40 has an output on line 44 which provides a first reference voltage VB1 and is fed to the input of the high level clamp circuit 30. The first reference voltage VB1 having a positive temperature coefficient is plotted at its curve A in FIG. 6 as a function of temperature. The bandgap generator 42 has an output on line 46 which provides a second reference voltage VB2 and is fed to the input of the sensing circuit 26. The second reference voltage VB2 having a negative temperature coefficient is plotted as curve B in FIG. 6 as a function of temperature.

Figure 5:
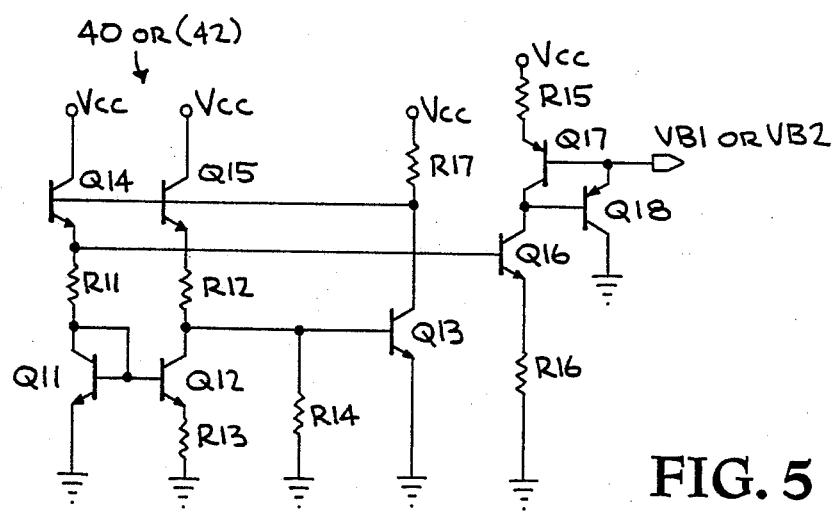
FIG. 5 is a schematic circuit diagram illustrating an implementation of the bandgap generators.

A conventional schematic circuit diagram of the bandgap generator 40(42) is illustrated in FIG. 5. The bandgap generator 40(42) is formed of transistors Q11–Q18 and resistors R11–R17. It should be apparent to those skilled in the art that the physical sizes of the various transistors Q11–Q18 and the particular resistance values of the various resistors R11–R17 can be properly designed so as to generate either the first reference voltage VB1 having the positive temperature coefficient or the second reference voltage VB2 having the negative temperature coefficient.

Figure 4:
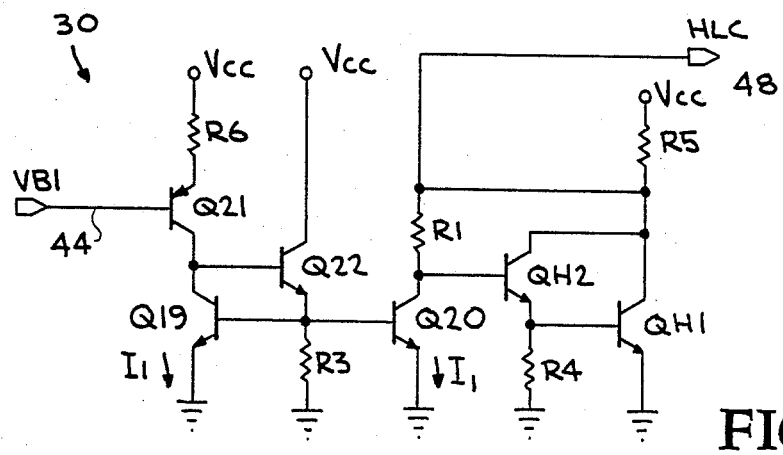
FIG. 4 is a schematic circuit diagram of a conventional high level clamp circuit of FIG. 2.

The first reference voltage VB1 on the line 42 is used to control a current I₁ which flows in the high level clamp circuit 30 and thus sets the high level clamp voltage $V_{HLC}$ at its output on line 48. A conventional schematic circuit diagram of the high level clamp circuit 30 is depicted in FIG. 4. The high level clamp circuit 30 is formed of transistors Q19–Q22, QH1, QH2 and resistors R1, R3–R6. Since the first reference voltage VB1 has a positive temperature coefficient, the current I₁ flowing through the transistor Q19 will therefore decrease with increasing temperatures. Due to the current mirror arrangement, this same current I₁ is reflected and flows through the transistor Q20. Thus, the high level clamp voltage $V_{HLC}$ can be expressed mathematically as follows:

$$V_{HLC} = I_1(R1) + V_{BE(QH1)} + V_{BE(QH2)} \tag{1}$$

where:
I₁ = current flowing through resistor R1
$V_{BE(QH1)}$ = base-emitter voltage across transistor QH1
$V_{BE(QH2)}$ = base-emitter voltage across transistor QH2

Accordingly equation (1) can be simplified to:

$$V_{HLC} = I_1 R1 + 2V_{BE} \tag{2}$$

The second reference voltage VB2 on the line 46 is used to control I₂ which flows in the sensing circuit 26. Since the second reference voltage VB2 has a negative temperature coefficient, the current I₂ flowing through the transistor Q23 will therefore increase with increasing temperatures. Due to the current mirror arrangement, this same current $I_2$ is reflected and flows through the transistor Q24.

Figure 3:
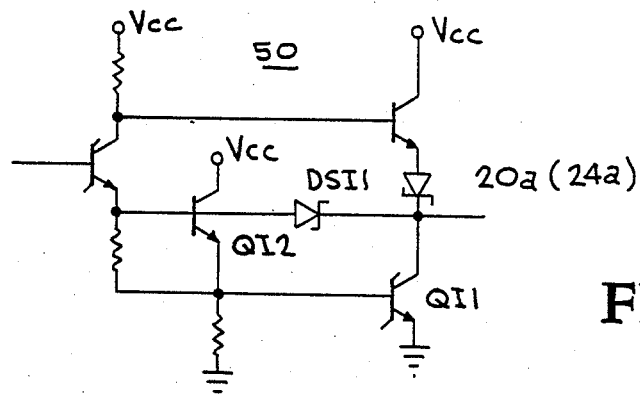
FIG. 3 is a schematic circuit diagram of an output section of the conventional input buffers of FIG. 2.

Each of the standard input buffers 14a ... 14n and 22a ... 22n includes a conventional output section 50 which is illustrated in a schematic circuit diagram form in FIG. 3. As can be seen, the output section 50 includes a Schottky transistor QI1, a bipolar transistor QI2 and a Schottky diode DSI1. The cathode of the diode DSI1 defines either the output of the respective input buffers 14a ... 14n to provide the inverted signals on the lines 20a ... 20n or the output of the respective input buffers 22a ... 22n to provide the non-inverted signals on the lines 24a ... 24n.

Now, the operation of the interface circuit 110 of this invention constructed as described above will be explained with reference to the voltage swing occurring at the common node or point P, which is the "OR-tied" connection. The low level voltage $V_L$ at the point P is determined by the output section 50 of the input buffer shown in FIG. 3 and is expressed as follows:

$$V_L = -V_{BE(QI1)} + V_{SD1} + V_{SDA} + (-V_{DSI1} + V_{BE(QI2)} + V_{BE(QI1)}) \quad (3)$$

where:

$V_{BE(QI1)}$ = base-emitter voltage across transistor Q1
$V_{SD1}$ = voltage drop across Schottky diode SD1
$V_{SDA}$ = voltage drop across array Schottky diode SDA
$V_{DSI1}$ = voltage drop across Schottky diode DSI
$V_{BE(QI2)}$ = base-emitter voltage across transistor QI2
$V_{BE(QI1)}$ = base-emitter voltage across transistor QI1

By designing the Schottky diode DSI in the output section 50 of the input buffer to be of the same type as the array Schottky SDA or $\overline{SDA}$, equation (3) can be simplified to:

$$V_L \approx V_{BE} + V_{SD} \quad (4)$$

The high level voltage $V_H$ is a function of the current $I_1$ at the point P and is determined by the high level clamp circuit 30 shown in FIG. 4 and is given by:

$$V_H = V_{HLC} + V_{SD2} - V_{BE(Q1)} \quad (5)$$

where:

$V_{SD2}$ = voltage drop across diode SD2
$V_{BE(Q1)}$ = base-emitter voltage across transistor Q1

By substituting for $V_{HLC}$ from equation (1) into the above equation, there is given:

$$V_H = (I_1 R1 + V_{BE(QH1)} + V_{BE(QH2)}) + V_{SD2} - V_{BE(Q1)} \quad (6)$$

This can be simplified to:

$$V_H = V_{BE} + V_{SD} + I_1 R1 \quad (7)$$

The voltage swing $V_{SW}$ between the high level voltage $V_H$ and the low level voltage $V_L$ is obtained by subtracting equation (4) from equation (7), or:

$$V_{SW} = V_H - V_L = I_1 R1 \quad (8)$$

When the point P is at the high level voltage $V_H$, the amount of resultant current $I_x$ on the line 32 flowing into the base of the phase splitter transistor Q2 in the output buffer 36 can be expressed approximately as follows:

$$I_x = I_T - I_2 \quad (9)$$

where:

$I_T$ = total current which flows through resistor R2
$I_2$ = current flowing through transistor Q24

Further, the total current $I_T$ is determined by the voltage across the resistor R2 divided by the resistance value of the resistor R2 and can be stated to be:

$$I_T = \frac{V_H - V_{BE(Q2)} - V_{BE(Q3)}}{R2} = \frac{V_H - 2V_{BE}}{R2} \quad (10)$$

where:

$V_{BE(Q2)}$ = base-emitter voltage across transistor Q2
$V_{BE(Q3)}$ = base-emitter voltage across transistor Q3

By substituting $V_H$ from equation (7) into equation (10), there is given:

$$I_T = \frac{(V_{BE} + V_{SD} + I_1 R1) - 2V_{BE}}{R2} = \frac{V_{SD} - V_{BE} + I_1 R1}{R2} \quad (11)$$

By inserting equation (11) for the total current $I_T$ into equation (9), the resultant current $I_x$ is determined to be:

$$I_x = \frac{V_{SD} - V_{BE} + I_1 R1}{R2} - I_2 \quad (12)$$

This resultant current $I_x$ is very critical in determining the switching speed of the phase splitter transistor Q2 and thus the switching speed of the pulldown output transistors Q3. As is known, the beta (current gain) of the transistors will be lower at cold temperatures (i.e., $-55°$ C.) and will be higher at hot temperatures (i.e., $+155°$ C.). Since the current gain of the phase splitter transistor Q2 will be lower at the cold temperatures, a larger current drive is required in order to quickly turn on the transistor Q2. However, a smaller current drive is necessary at the higher temperatures due to the increasing beta with respect to temperature so as to prevent excessive base drive which causes the transistor Q2 to saturate, thereby increasing its turn-off time.

As can be seen from the above equation (12), the resultant base drive current $I_x$ has been shown to be functions of the current $I_1$ controlled by the first bandgap generator 40 and of the current $I_2$ controlled by the second bandgap generator 42. As will be recalled, the first bandgap generator 40 is designed to provide the first reference voltage VB1 having the positive temperature coefficient and thus the current $I_1$ will be decreasing with rising temperatures. The second bandgap generator 42 is designed to provide the second reference voltage VB2 having the negative temperature coefficient and thus the current $I_2$ will be increasing with rising temperatures. Accordingly, at the cold temperature of $=55°$ C. the current $I_1$ will be higher and the current $I_2$ will be lower. On the other hand, at the hot temperature of $+155°$ C. the current $I_1$ will be lower and the current $I_2$ will be higher. Therefore, the resultant base drive current $I_x$ will be increased at the cold temperatures and will be decreased at the hot temperatures so as to optimize the switching speed of the phase splitter transistor Q2.

The threshold voltage $V_{TH}$ at which the switching occurs is determined when the total current $I_T$ is equal to the current $I_2$ or $I_x=0$. From equation (12), the threshold voltage $V_{TH}$ is defined by setting the resultant current $I_x=0$ and solving for $V_H$ which is the voltage at the point p. Thus, $$V_{TH}=V_H=2V_{BE}+I_2R2 \qquad (13)$$

Therefore, the difference between the threshold voltage $V_{TH}$ and the low level voltage $V_L$ is obtained by subtracting equation (4) from equation (13) and is given by:

$$V_{TH}-V_L=2V_{BE}+I_2R2-(V_{BE}+V_{SD}) \qquad (14)$$

By simplifying, there is given:

$$\Delta V_{TH}=(V_{BE}-V_{SD})+V_2R2 \qquad (15)$$

From the above equation (15) it can be seen that the first term $(V_{BE}-V_{SD})$ will decrease with rising temperatures since it is known that both the base-emitter voltage drop of a transistor and the junction drop across the Schottky diode have negative temperature coefficients. Further, the second term $(I_2R2)$ will increase with rising temperatures since both the current $I_2$ and the resistance R2 will be increasing over temperature and thus compensating for the effect of the first term. As a net result, the $\Delta V_{TH}$ is designed to be maintained substantially constant over the operating temperature range of $-55°$ C. to $+155°$ C.

Figure 7:
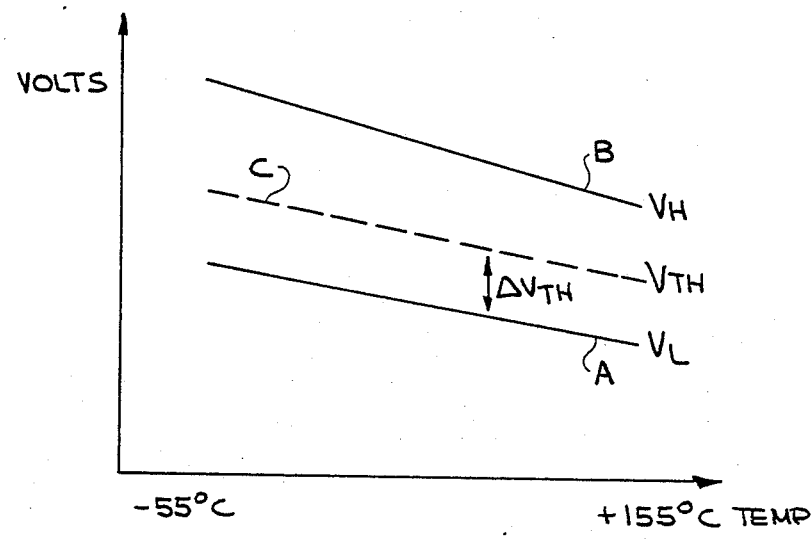
FIG. 7 are plots of the high level voltage $V_H$, low level voltage $V_L$ and the threshold level voltage $V_{TH}$ showing its operating characteristics over the temperature range.

The low level voltage $V_L$ from equation (4) is plotted as curve A in FIG. 7 as a function of temperature. The high level voltage $V_H$ from equation (7) is plotted as curve B in FIG. 7 as a function of temperature. The threshold voltage $V_{TH}$ from equation (13) is plotted as curve C in FIG. 7 as a function of temperature. Consequently, by making a substantially constant $\Delta V_{TH}$ over temperature, the switching speed of the phase splitter transistor Q2 is not reduced at the higher temperatures, thereby effecting a high speed of operation over the entire temperature range.

From the foregoing detailed description, it can thus be seen that the interface circuit of the present invention has eliminated extra propagation delays due to the elimination of a buffer 34 having two inverter stages. Further, the high switching speed of the phase splitter transistor Q2 in the output buffer 36 is maintained over a wide temperature range by the provision of two independent bandgap generators which have opposite temperature coefficients.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An interface circuit (110) for interfacing between an "OR-tied" connection (P) of a programmable logic array device (10) and a TTL output buffer (36) so as to provide a high speed of operation over a wide range of temperature variations, said interface circuit comprising:
    first generator means (40) for generating a first reference voltage (VB1) having a positive temperature coefficient;
    high level clamp means (30) responsive to the first reference voltage (VB1) for producing a first current ($I_1$) which decreases with rising temperatures;
    second generator means for generating a second reference voltage (VB2) having a negative temperature coefficient;
    sensing means (26) having an input connected to the "OR-tied" connection (P) of the programmable logic array device (10) to receive a voltage corresponding to the first current ($I_1$) and being responsive to the second reference voltage (VB2) for producing a second current ($I_2$) which increases with rising temperatures, said sensing means (26) combining said first and second currents ($I_1$, $I_2$) to generate a resultant base drive current ($I_x$) which is higher at low temperatures and is smaller at high temperatures; and
    the output buffer (36) having a phase splitter transistor (Q2) whose base is connected to receive the resultant base drive current ($I_x$), whereby the switching speed of the phase splitter transistor (Q2) remains substantially constant over a wide range of temperature variations.

2. An interface circuit as claimed in claim 1, wherein said first generator means comprises a first bandgap generator (40).

3. An interface circuit as claimed in claim 2, wherein said second generator means comprises a second bandgap generator (42).

4. An interface circuit as claimed in claim 3, wherein said high level clamp means comprises a high level clamp circuit (30).

5. An interface circuit as claimed in claim 4, wherein said sensing means comprises a sensing circuit (26).

6. An interface circuit as claimed in claim 5, wherein said phase splitter transistor (Q2) is of the NPN-type conductivity.

7. An interface circuit as claimed in claim 6, wherein said phase splitter transistor (Q2) is a Schottky transistor.

8. An interface circuit as claimed in claim 1, wherein said temperature range is between $-55°$ C. and $+155°$ C.

9. A programmable logic array device having an "OR-tied" connection and used for driving an output buffer so as to provide a high speed of operation over a wide range of temperature variations, said device comprising:
    a plurality of input buffers (14a ... 14n), each of said plurality of input buffers having an input for receiving an input logic signal and an output;
    a plurality of output transistors (Q1a ... Q1n), each of said plurality of transistors having its base coupled to the respective outputs of said input buffers (14a ... 14n), its collector connected to a supply potential, and its emitter connected to a common node defining the "OR-tied" connection (P);

first generator means (40) for generating a first reference voltage (VB1) having a positive temperature coefficient;

high level clamp means (30) responsive to the first reference voltage (VB1) for producing a first current ($I_1$) which decreases with rising temperatures;

second generator means for generating a second reference voltage (VB2) having a negative temperature coefficient;

sensing means (26) having an input connected to the common node (P) to receive a voltage corresponding to the first current ($I_1$) and being responsive to the second reference voltage (VB2) for producing a second current ($I_2$) which increases with rising temperatures, said sensing means (26) combining said first and second currents ($I_1$, $I_2$) to generate a resultant base drive current ($I_x$) which is higher at low temperatures and is smaller at higher temperatures; and the output buffer (36) having a phase splitter transistor (Q2) whose base is connected to receive the resultant base drive current ($I_x$), whereby the switching speed of the phase splitter transistor (Q2) remains substantially constant over a wide range of temperature variations.

10. An array device as claimed in claim 9, wherein said first generator means comprises a first bandgap generator (40).

11. An array device as claimed in claim 10, wherein said second generator means comprises a second bandgap generator (42).

12. An array device as claimed in claim 11, wherein said high level clamp means comprises a high level clamp circuit (30).

13. An array device as claimed in claim 12, wherein said sensing means comprises a sensing circuit (26).

14. An array device as claimed in claim 13, wherein said phase splitter transistor (Q2) is of the NPN-type conductivity.

15. An array device as claimed in claim 14, wherein said phase splitter transistor (Q2) is a Schottky transistor.

16. An array device as claimed in claim 9, wherein said temperature range is between $-55°$ C. and $+155°$ C.

* * * * *